(12) United States Patent
Jeong et al.

(10) Patent No.: US 11,488,942 B2
(45) Date of Patent: Nov. 1, 2022

(54) PACKAGE STRUCTURE

(71) Applicant: SAMSUNG ELECTRO-MECHANICS CO., LTD., Suwon-si (KR)

(72) Inventors: Chi Hyeon Jeong, Suwon-si (KR); Seong Hwan Lee, Suwon-si (KR); Sang Jong Lee, Suwon-si (KR); Hyun Sang Kwak, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 64 days.

(21) Appl. No.: 17/179,969

(22) Filed: Feb. 19, 2021

(65) Prior Publication Data
US 2022/0157794 A1    May 19, 2022

(30) Foreign Application Priority Data
Nov. 13, 2020  (KR) .......................... 10-2020-0152196

(51) Int. Cl.
| | |
|---|---|
| *H01L 25/10* | (2006.01) |
| *H01L 23/31* | (2006.01) |
| *H01L 23/538* | (2006.01) |

(52) U.S. Cl.
CPC ........ *H01L 25/105* (2013.01); *H01L 23/3121* (2013.01); *H01L 23/5387* (2013.01); *H01L 23/5389* (2013.01); *H01L 2225/1035* (2013.01); *H01L 2225/1058* (2013.01)

(58) Field of Classification Search
CPC ............... H01L 25/105; H01L 23/3121; H01L 23/5387; H01L 23/5389; H01L 2225/1035; H01L 2225/1058
See application file for complete search history.

(56) References Cited

U.S. PATENT DOCUMENTS

| | | | | |
|---|---|---|---|---|
| 6,683,377 | B1 * | 1/2004 | Shim ................... | H01L 23/5387 438/109 |
| 2004/0021211 | A1 * | 2/2004 | Damberg ............ | H01L 23/5385 257/E25.011 |
| 2012/0261814 | A1 * | 10/2012 | Slavov ................ | H01L 25/0657 257/737 |

(Continued)

FOREIGN PATENT DOCUMENTS

| | | |
|---|---|---|
| JP | 2006-237232 A | 9/2006 |
| JP | 2006-319197 A | 11/2006 |
| KR | 10-2066903 B1 | 1/2020 |

OTHER PUBLICATIONS

"Properties of Flex-Rigid PCB Used for Automotives," (https://www.pcbcart.com/article/content/properties-of-flex-rigid-pcb-for-automot.html).

(Continued)

*Primary Examiner* — Fernando L Toledo
*Assistant Examiner* — Neil R Prasad
(74) *Attorney, Agent, or Firm* — Morgan, Lewis & Bockius LLP

(57) ABSTRACT

A package structure includes a first package including a first substrate and a first molded portion disposed on the first substrate; and a rigid-flexible substrate disposed on at least a portion of the first package and having a rigid region and a flexible region. The first molded portion is disposed between the first substrate and the rigid-flexible substrate.

21 Claims, 5 Drawing Sheets

(56) References Cited

U.S. PATENT DOCUMENTS

2013/0112754 A1\* 5/2013 Ikemoto ............. G06K 7/10336
235/488
2018/0130757 A1\* 5/2018 Haba ................... H01L 23/3121
2019/0288371 A1\* 9/2019 Kamgaing .......... H01L 23/3128
2020/0014090 A1 1/2020 Jung et al.

OTHER PUBLICATIONS

M-C Hsieh, "Advanced Flip Chip Package on Package Technology for Mobile Applications," Originally published in the 17th International Conference on Electronic Packaging Technology (ICEPT), Wuhan, China, Aug. 16-19, 2016.

\* cited by examiner

PACKAGE STRUCTURE

CROSS-REFERENCE TO RELATED APPLICATION(S)

This application claims benefit of priority to Korean Patent Application No. 10-2020-0152196 filed on Nov. 13, 2020 in the Korean Intellectual Property Office, the disclosure of which is incorporated herein by reference in its entirety.

TECHNICAL FIELD

The present disclosure relates to a package structure.

BACKGROUND

A molded laser package (MLP) may be used for interconnection of package-on-package-top (PoPt) and package-on-package-bottom (PoPb) in a package-on-package (PoP) structure, and may be widely used, in particular, as a combination of a high-end application processor (AP) and a memory. Recently, as the number of bumps of AP and memory increases, the number of solder balls of the PoPb using the MLP may also increase, to increase a size of the package.

Accordingly, there may be a need for a package structure capable of entirely reducing the number of solder balls and bumps in a package, to reduce a size of the package and maintain a signal transmission path at the same time.

SUMMARY

An aspect of the present disclosure is to provide a package structure capable of reducing a size of a package.

Another aspect of the present disclosure is to provide a package structure capable of transmitting a signal between packages along a path, other than a mainboard.

According to an aspect of the present disclosure, a package structure includes a first package including a first substrate and a first molded portion disposed on the first substrate; and a rigid-flexible substrate disposed on at least a portion of the first package and having a rigid region and a flexible region. The first molded portion is disposed between the first substrate and the rigid-flexible substrate.

According to another aspect of the present disclosure, a package mounting substrate includes a mainboard; a first package and a second package, disposed on the mainboard and including a first substrate and a second substrate, respectively; a solder ball connecting the mainboard to the first and second substrates; and a rigid-flexible substrate including first and second rigid regions and first and second flexible regions. The first rigid region is disposed on at least a portion of the first package to be connected to the first package, and the second rigid region is disposed on at least a portion of the second package to be connected to the second package.

According to another aspect of the present disclosure, a package mounting substrate includes a first package, and a rigid-flexible substrate including a rigid region disposed on a portion of the first package and a flexible region extending from the rigid region and disposed outside the first package.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
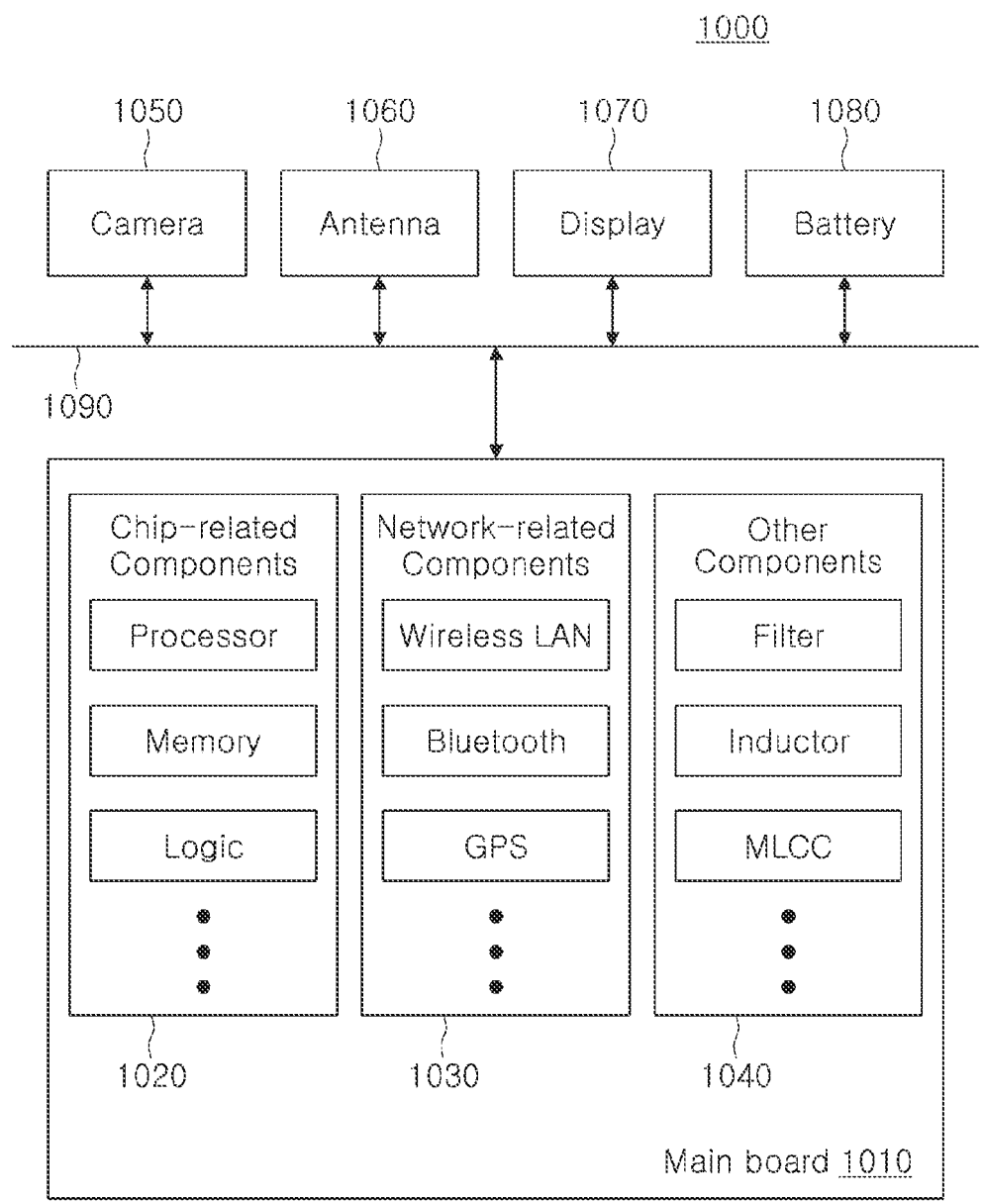
FIG. 1 is a block diagram schematically illustrating an example of an electronic device system.

Hereinafter, the present disclosure will be described with reference to the accompanying drawings. Shapes and sizes of the components in the drawings may be exaggerated or reduced for clarity of description.

FIG. 1 is a block diagram schematically illustrating an example of an electronic device system.

Referring to the drawings, an electronic device 1000 may accommodate a mainboard 1010 therein. The mainboard 1010 may include chip related components 1020, network related components 1030, other components 1040, and the like, physically and/or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like. However, the chip related components 1020 are not limited thereto, but may also include other types of chip related components. In addition, the chip related components 1020 may be combined with each other. The chip related component 1020 may be in the form of a package including the above-described chip or an electronic component.

The network related components 1030 may include components compatible with or communicating using various protocols such as wireless fidelity (Wi-Fi) (Institute of Electrical and Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components compatible with or communicating using a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 and/or the network related components 1030 described above.

Depending on a type of the electronic device 1000, the electronic device 1000 may include other components that may or may not be physically and/or electrically connected to the mainboard 1010. These other components may include, for example, a camera module 1050, an antenna module 1060, a display device 1070, a battery 1080, or the like. However, these other components are not limited thereto, but may also include an audio codec, a video codec, a power amplifier, a compass, an accelerometer, a gyroscope, a speaker, amass storage unit (for example, a hard disk drive), a compact disk (CD) drive, a digital versatile disk (DVD) drive, or the like. These other components may also include other components used for various purposes, depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
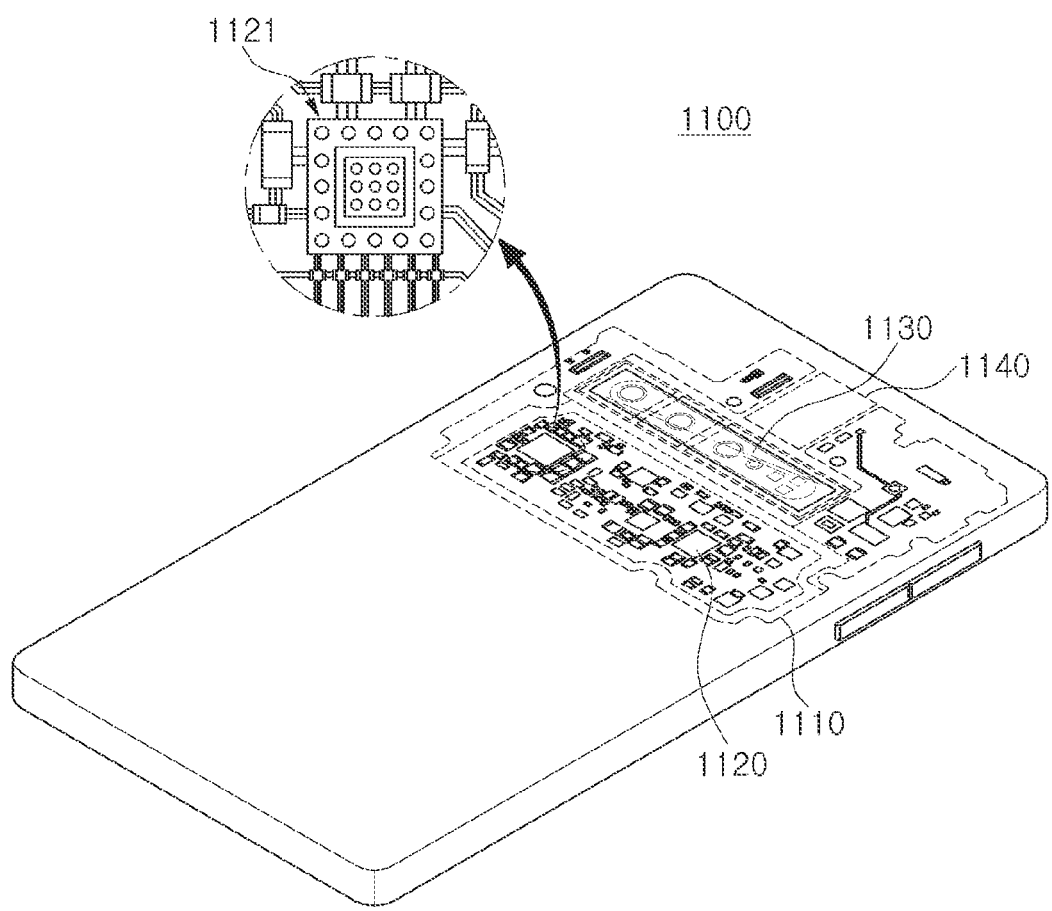
FIG. 2 is a perspective view schematically illustrating an example of an electronic device.

FIG. 2 is a perspective view schematically illustrating an example of an electronic device.

Referring to the drawings, an electronic device may be, for example, a smartphone 1100. A mainboard 1110 may be accommodated in the smartphone 1100, and various electronic components 1120 may be physically and/or electrically connected to the mainboard 1110. In addition, other electronic components, such as a camera module 1130 and/or a speaker 1140, which may or may not be physically and/or electrically connected to the mainboard 1110, may be accommodated therein. A portion of the electronic components 1120 may be the above-described chip related components, for example, an electronic component embedded substrate 1121, but are not limited thereto. The electronic component embedded substrate 1121 may be provided as a surface-mounted form in which a semiconductor chip or a passive component is mounted on a printed circuit board, but is not limited thereto. The electronic device is not necessarily limited to the smartphone 1100, but may be other electronic devices as described above.

Figure 3:
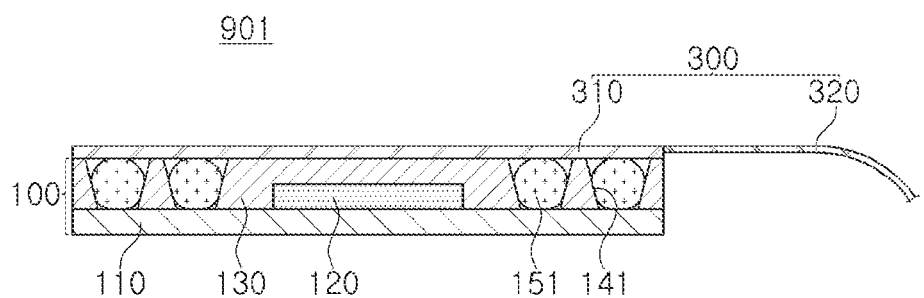
FIG. 3 is a cross-sectional view schematically illustrating a package structure according to a first embodiment of the present disclosure.

FIG. 3 is a cross-sectional view schematically illustrating a package structure according to a first embodiment of the present disclosure.

Referring to the drawing, a package structure 901 according to a first embodiment of the present disclosure may include a first package 100 and a rigid-flexible substrate 300 disposed on the first package 100.

The first package 100 may include a first substrate 110, a first electronic component 120 disposed on the first substrate 110, a first molded portion 130 disposed on the first substrate 110 and covering the first electronic component 120, a first via 141 formed in the first molded portion 130, and a first connection member 151 disposed in the first via 141.

The rigid-flexible substrate 300 may be divided into a rigid region 310 and a flexible region 320. In this case, the rigid region 310 may be a portion having flexibility, less than flexibility of the flexible region 320, the flexible region 320 may be a portion having flexibility, greater than flexibility of the rigid region 310, and at least a portion of the flexible region 320 may be bent.

Hereinafter, a configuration of the package structure 901 according to the first embodiment will be described in more detail.

The first substrate 110 may be a component of the first package 100. Although not illustrated, the first substrate 110 may include a plurality of insulating layers, and a plurality of wiring layers and a plurality of vias, disposed on the plurality of insulating layers therein to transmit signals. In addition, in a similar manner to formation of a plurality of wiring layers, a first pad (not illustrated) connecting the first substrate 110 with an external component may be disposed on an external layer of the first substrate 110, and a solder resist layer exposing at least a portion of the first pad may be disposed.

An insulating material may be used as the insulating layer. In this case, as the insulating material, a material including a thermosetting resin such as an epoxy resin, a thermoplastic resin such as polyimide, or a reinforcing material such as a glass fiber and/or an inorganic filler, together therewith, for example, a prepreg, Ajinomoto build-up film (ABF), or the like may be used.

As the wiring layer, a metal material may be used. In this case, as the metal material, copper (Cu), aluminum (Al), silver (Ag), tin (Sn), gold (Au), nickel (Ni), lead (Pb), titanium (Ti), alloys thereof, or the like may be used. Core wiring layers may be formed by plating processes such as an additive process (AP), a semi-additive process (SAP), a modified semi-additive process (MSAP), a tenting (TT) process, or the like, respectively. As a result, a seed layer, which may be an electroless plating layer, and an electrolytic plating layer formed based on the seed layer may be included. The wiring layer may perform various functions, depending on a design of a layer of interest. For example, aground (GND) pattern, a power (PWR) pattern, a signal (S) pattern, and the like may be included. In this case, the signal (S) pattern may include various signals except for the ground (GND) pattern, the power (PWR) pattern, and the like, for example, a data signal, and the like. As necessary, the ground (GND) pattern and the power (PWR) pattern may be the same pattern as each other. These patterns may each include a line pattern, a plane pattern, and/or a pad pattern.

The first electronic component 120 may be disposed on the first substrate 110, and may be electrically connected to the first substrate 110. The first electronic component 120 may have a pad, attached to the outside, for electrical connection with the first substrate 110. Hundreds to millions of devices or more may be an integrated circuit (IC) die integrated in one chip. For example, the first electronic component 120 may be a processor chip such as a central processing unit (e.g., CPU), a graphics processing unit (e.g., GPU), a field programmable gate array (FPGA), a digital signal processor, an encryption processor, a microprocessor, a microcontroller, or the like, specifically, an application processor (AP), but is not limited thereto. In addition to the above, a memory such as a volatile memory (e.g., DRAM), a non-volatile memory (e.g., ROM), a flash memory, or the like, or a logic such as an analog-to-digital converter, an application-specific integrated circuit (ASIC), or the like. As necessary, the first electronic component 120 may be a passive component in the form of a chip, for example, an inductor in the form of a chip, a capacitor in the form of a chip, or the like.

The first molded portion 130 may be disposed on an upper surface of the first substrate 110 to cover the first electronic component 120 mounted on the upper surface, to protect the first electronic component 120 from an external environment, and may be formed to have a certain thickness. The first molded portion 130 may be formed by selecting one of those used as molding materials in the same technical field, including, for example, silicon, an epoxy molding compound, polyphenylene oxide, epoxy sheet molding, or the like.

The first via 141 may be formed in at least a portion of the first molded portion 130, and at least a portion of the first substrate 110 may be exposed to the first via 141 by processing of the first molded portion 130. Specifically, although not illustrated, the first pad disposed on the external layer of the first substrate 110 may be exposed by the first via 141, and the exposed first pad may be electrically connected to the first connection member 151 to be described later. In the processing of the first molded portion 130, a laser processing method may be used, and a conventional via processing method such as a $CO_2$ laser, a YAG laser, or the like may be selected and used. The first via 141 may be formed around the first electronic component 120 protected by the first molded portion 130. Even though the first via 141 does not surround the first electronic component 120, the first via 141 may only be formed on one side of the first molded portion 130 based on the first electronic component 120. Although not illustrated, a first pad for an electrical connection with an external component may be formed on an external layer of the first substrate 110, and at least a portion of the first pad may be exposed to the first via 141.

The first connection member 151 may be disposed in the first via 141. The first connection member 151 may provided as a plurality of first connection members 151, each of the plurality of first connection members 151 may have a vertical diameter and a horizontal diameter, and the plurality of first connection members 151 may be provided on the same level as an upper surface of the molding layer. The first connection member 151 may have the solder ball shape, illustrated in FIG. 3, by pasting a conductive metal to fill in the first via 141 and then curing and/or reflowing the conductive metal. A material of the conductive metal used as the first connection member 151 may include one or more metals selected from tin (Sn), lead (Pb), silver (Ag), and gold (Au), but is not limited thereto, and may further include a conductive polymer. The first connection member 151 may be disposed on the first pad of the first substrate 110 described above. Specifically, the first connection member 151 may be disposed on the first pad 111 of the first substrate 110 exposed into the first via 141, to electrically connect the first substrate 110 to other component(s) disposed in an upper portion of the package structure 901.

A signal transmission path of the first substrate 110 may be formed to pass through the first molded portion 130 in addition to a lower portion of the first substrate 110, to reduce the number of connection members, such as solder balls, solder bumps, or the like, to be disposed below the first substrate 110. Therefore, a size of the first package 100 may be reduced, and a new signal transmission path may be formed indirectly.

In addition, due to the reduction in package size, an additional input/output (I/O) terminal (s) may be formed or an additional component(s) may be disposed. Therefore, it may be advantageous for integration and miniaturization of a component.

Hereinafter, a configuration of the rigid-flexible substrate 300 will be described in more detail.

The rigid-flexible substrate 300 may include a rigid region 310 and a flexible region 320, and the rigid region 310 and the flexible region 320 may refer to a region in the rigid-flexible substrate 300 according to this embodiment, respectively.

The rigid-flexible substrate 300 may include a flexible insulating layer continuously formed in the rigid region 310 and the flexible region 320, and the flexible insulating layer may be formed of an insulating material, which may be supple and flexible. For example, the flexible insulating layer may be formed of an insulating material including polyimide (PI), liquid crystal polymer (LCP), or the like, but is not limited thereto. For example, any flexible electrical insulating material may be used as the flexible insulating layer applied to this embodiment without limitation.

The rigid region 310 of the rigid-flexible substrate 300 may include a plurality of rigid insulating layers disposed on the flexible insulating layer. The rigid insulating layers may be formed of an insulating material having relatively low flexibility, and may be formed of prepreg (PPG) including an insulating resin such as an epoxy resin or the like. Alternatively, the rigid insulating layers may be formed of a build-up film such as Ajinomoto Build-up Film (ABF) including an insulating resin such as an epoxy resin or the like. Alternatively, the rigid insulating layers may be a photosensitive insulating layer containing a photosensitive electrical insulating resin. In particular, the insulating material containing the epoxy resin may contain a fiber reinforcement material such as glass fiber, may also contain an inorganic filler.

Although not illustrated, a plurality of circuit patterns and a plurality of via layers, disposed on the flexible insulating layer and the plurality of rigid insulating layers, may be disposed in the rigid region 310 of the rigid-flexible substrate 300 to function as a signal transmission path.

A metal material may be used as materials of the plurality of circuit patterns and the plurality of via layers. In this case, as the metal material, copper (Cu), aluminum (Al), silver (Ag), tin (Sn), gold (Au), nickel (Ni), lead (Pb), titanium (Ti), alloys thereof, or the like may be used. The core wiring layers may be formed by plating processes such as an additive process (AP), a semi-additive process (SAP), a modified semi-additive process (MSAP), a tenting (TT) process, or the like, respectively. As a result, a seed layer, which may be an electroless plating layer, and an electrolytic plating layer formed based on the seed layer may be included.

In the flexible region 320 of the rigid-flexible substrate 300, a flexible insulating layer formed of the above-described insulating material, which may be supple and flexible, may be disposed, the circuit pattern disposed on the flexible insulating layer may be included, and a protective layer protecting the circuit pattern may be additionally covered. The protective layer disposed on the flexible region 320 may be a coverlay made of a material, which may be supple and flexible. Alternatively, the protective layer formed on the flexible region 320 may be formed of ink, and even in this case, the flexible region 320 may be bent.

In the package structure 901 according to the first embodiment of the present disclosure, a structure in which the rigid-flexible substrate 300 is disposed on the first package 100 may be disclosed. Specifically, a region of the rigid-flexible substrate 300 disposed on the first package 100 may correspond to the rigid region 310, and the flexible region 320 of the rigid-flexible substrate 300 may not be disposed on the first package 100, but may be disposed to protrude from a lateral surface of the first package 100.

In addition, in the rigid region 310 disposed on the first package 100, an upper surface of the first molded portion 130 may be covered, and, the first via 141 formed in the first molded portion 130 may thus be covered. Therefore, the rigid region 310 may be electrically connected to the first connection member 151 disposed in the first via 141 of the first molded portion 130. Although not illustrated, a pad for connection may be disposed below the rigid region 310, to be in contact with and electrically connected to the first connection member 151.

As a result, the first substrate 110 and the rigid-flexible substrate 300 may be electrically connected to each other, and the rigid-flexible substrate 300 may perform a function of connecting the first package 100 to other external component(s). As disclosed in FIG. 3, one end portion of the flexible region 320 may be connected to the rigid region 310, and the other end portion thereof may be electrically connected to other external component (s).

Figure 4:
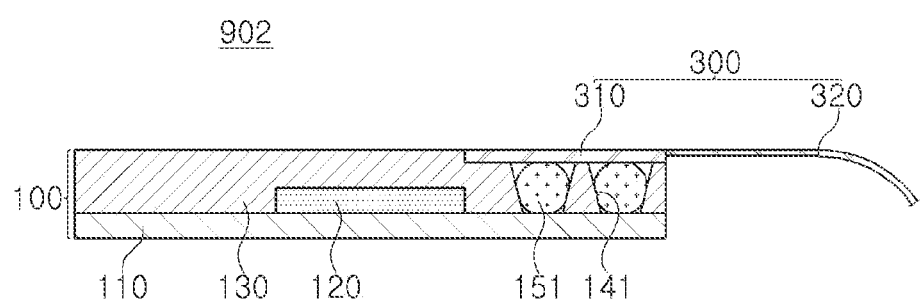
FIG. 4 is a cross-sectional view schematically illustrating a package structure according to a second embodiment of the present disclosure.

FIG. 4 is a cross-sectional view schematically illustrating a package structure according to a second embodiment of the present disclosure.

A package structure 902 according to a second embodiment of the present disclosure may include a first molded portion 130 have a different shape, as compared to the package structure 901 according to the first embodiment. Therefore, a region in which a rigid-flexible substrate 300 is disposed on a first package 100 may be changed. Therefore, with regard to a configuration of the package structure 902 overlapping the configuration of the package structure 901 according to the first embodiment of the present disclosure, the same description as the package structure 901 according to the first embodiment of the present disclosure may be applied, and, with respect to the package structure 902 according to the second embodiment, a description will be made focusing on a portion changed from the previous embodiment.

Referring to FIG. 4, a structure of a package structure 902 according to a second embodiment of the present disclosure may be illustrated. In the second embodiment, a rigid region 310 of a rigid-flexible substrate 300 may be disposed in a region on a first molded portion 130.

Therefore, in the package structure 902 according to the second embodiment of the present disclosure, an upper surface of the first molded portion 130 may have a step difference. The step difference may be formed in a region in which the rigid region 310 is disposed, among the upper surface of the first molded portion 130. In this case, a thickness of the first molded portion 130 in a region in which the rigid region 310 is not disposed may be greater than a thickness of the first via 141. In this case, the thickness of the first via 141 may be interpreted as having the same meaning as a depth of the first via 141 in the same direction as a stacking direction in which the first substrate 110, the first electronic component 120, and the first molded portion 130 are stacked.

In the package structure 902 according to the second embodiment of the present disclosure, the rigid region 310 of the rigid-flexible substrate 300 may not be a structure covering the entire surface of the first molded portion 130, but may only be disposed in a region of the first molded portion 130. No via may be formed in a region of the first molded portion 130 in which the rigid region 310 is not disposed. Therefore, the first electronic component 120 may be more stably protected.

In addition, in consideration of an arrangement relationship with an external configuration, the rigid-flexible substrate 300 may be selectively disposed on the first package 100 to achieve a more diverse product design.

Figure 5:
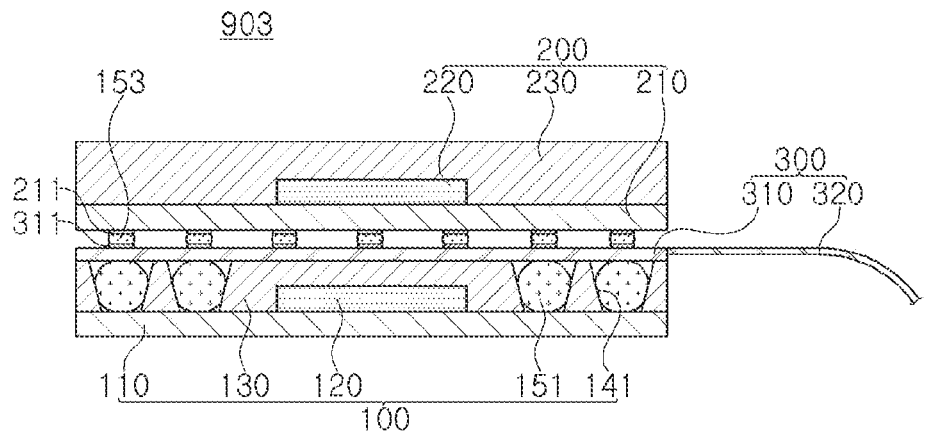
FIG. 5 is a cross-sectional view schematically illustrating a package structure according to a third embodiment of the present disclosure.

FIG. 5 is a cross-sectional view schematically illustrating a package structure according to a third embodiment of the present disclosure.

A package structure 903 according to a third embodiment of the present disclosure, illustrated in FIG. 5, may be different from the package structure 901 according to the first embodiment, in view of the fact that a second package 200 is further included, and a third connection member 153 is disposed. Therefore, with regard to a configuration of the package structure 903 overlapping the package structure 901 according to the first embodiment of the present disclosure, the same description as the package structure 901 according to the first embodiment of the present disclosure may be applied, and, with respect to the package structure 903 according to the third embodiment, a description will be made focusing on a portion changed from the previous embodiment.

Referring to FIG. 5, a package structure 903 according to a third embodiment of the present disclosure may further include a second package 200 and a third connection member 153, on a first package 100 and a rigid-flexible substrate 300.

The second package 200 may include a second substrate 210, a second electronic component 220 disposed on the second substrate 210, and a second molded portion 230 disposed on the second substrate 210 and covering the second electronic component 220. Regarding the second substrate 210, the second electronic component 220, and the second molded portion 230, which may be components of the second package 200, the descriptions of the first substrate 110, the first electronic component 120, and the first molded portion 130 may be equally applied, and overlapped descriptions thereof will be omitted.

The second package 200 may include a second pad 211 below the second substrate 210. A metal material may be used as a material of the second pad 211. In this case, as the metal material, copper (Cu), aluminum (Al), silver (Ag), tin (Sn), gold (Au), nickel (Ni), lead (Pb), titanium (Ti), alloys thereof, or the like may be used.

In the third embodiment, the rigid-flexible substrate 300 may include a plurality of rigid insulating layers, a plurality of circuit layers, and a plurality of via layers in the rigid region 310 as described above. Referring to FIG. 5, on an external layer of the rigid region 310, a third pad 311 for electrical connection with other component(s) may be disposed.

The rigid-flexible substrate 300 disposed on the first package 100, and the second package 200 may be connected in a land grid array (LGA) type structure. In this case, in a manner in which the second substrate 210 is connected to an electrode below the second substrate 210 through a pin, to detach the second package 200 on the rigid-flexible substrate 300, a thick electroless gold plating layer may be disposed to prevent corrosion due to exposure to air and to minimize damage due to physical contact with the pin.

In the above structure, the second pad 211 of the second substrate 210 may be electrically connected through the third pad 311 and the third connection member 153, disposed in the rigid region 310 of the rigid-flexible substrate 300. By this structure, each of the first and second packages 100 and 200 may be electrically connected to other external component(s) or other packages through the rigid-flexible substrate 300, and other electrical signal transmission paths may be formed without using a mainboard. Therefore, an effect of minimizing signal loss due to shortening of the signal transmission path may be achieved.

Although the second and third pads 211 and 311 are illustrated as having a protruding structure, a solder resist layer having an opening may be further disposed on the second and third pads 211 and 311, to expose only a region of each of the second and third pads 211 and 311, while protecting the second and third pads 211 and 311.

The third connection member 153 may electrically connect the second pad 211 and the third pad 311. As a material of a conductive metal used as the third connection member 153, like the first connection member 151, at least one metal selected from tin (Sn), lead (Pb), silver (Ag), and gold (Au) may be included, but is not limited thereto, and a conductive polymer may be further included.

As illustrated in FIG. 5, the second package 200 may be disposed on the first package 100 and the rigid-flexible substrate 300, to complete a package-on-package (POP) structure. Thereby, it is possible to reduce in size and integrate the entire package on an X-Y plane.

In addition, the package structure 903 according to the third embodiment may reduce an amount of solder volume of the third connection member 153 disposed between the first and second packages 100 and 200, based on the LGA type. In addition, this volume reduction effect may contribute to a volume reduction effect of the package structure 903 to be finally produced.

Figure 6:
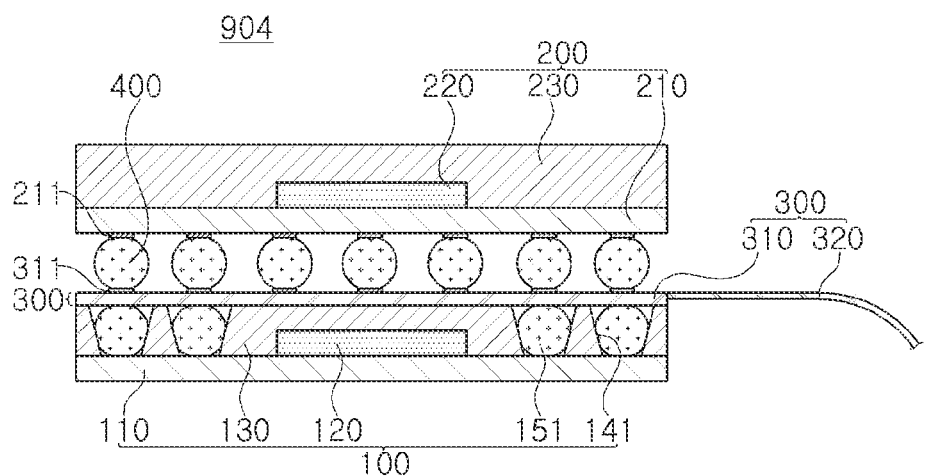
FIG. 6 is a cross-sectional view schematically illustrating a package structure according to a fourth embodiment of the present disclosure.

FIG. 6 is a cross-sectional view schematically illustrating a package structure according to a fourth embodiment of the present disclosure.

A package structure 904 according to a fourth embodiment of the present disclosure, illustrated in FIG. 6, may be different from the package structure 903 according to the third embodiment, in view of the fact that a second package 200 and a rigid-flexible substrate 300 are connected in a ball grid array (BGA) type structure. Therefore, with regard to a configuration of the package structure 904 overlapping the package structure 903 according to the third embodiment of the present disclosure, the same description as the package structure 903 according to the third embodiment of the present disclosure may be applied, and, with respect to the package structure 904 according to the fourth embodiment, a description will be made focusing on a portion changed from the previous embodiment.

Referring to FIG. 6, in a package structure 904 according to the fourth embodiment, on a third pad 311 disposed in a rigid region 310 of a rigid-flexible substrate 300, a solder ball 400 may be disposed. A material of the solder ball 400 may include one or more metals selected from tin (Sn), lead (Pb), silver (Ag), and gold (Au), but is not limited thereto, and a conductive polymer may be additionally included.

In the package structure 904 according to the fourth embodiment of FIG. 6, since the second package 200 may be disposed on the rigid-flexible substrate 300 in a BGA type structure using the solder ball 400, a heat dissipation effect by the solder ball 400 may be improved, excellent thermal properties may be obtained, and productivity due to self-alignment by a wide pitch and surface tension of the solder ball may increase.

Figure 7:
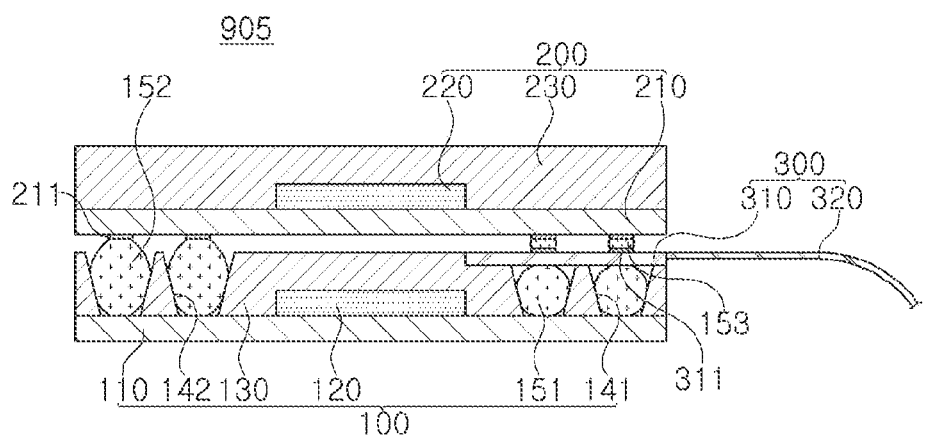
FIG. 7 is a cross-sectional view schematically illustrating a package structure according to a fifth embodiment of the present disclosure.

FIG. 7 is a cross-sectional view schematically illustrating a package structure according to a fifth embodiment of the present disclosure.

The package structure 905 according to a fifth embodiment of the present disclosure, illustrated in FIG. 7, may be different from the package structure 902 according to the second embodiment, in view of the fact that a second package 200 is further included, and a second via 142 and second and third connection members 152 and 153 are disposed. Therefore, with regard to a configuration of the package structure 905 overlapping the package structure 902 according to the second embodiment of the present disclosure, the same description as the package structure 902 according to the second embodiment of the present disclosure may be applied, and, with respect to the package structure 905 according to the fifth embodiment, a description will be made focusing on a portion changed from the previous embodiment.

Referring to FIG. 7, in a similar manner to the package structure 902 according to the second embodiment, in a package structure 905 according to the fifth embodiment, a rigid-flexible substrate 300 may be disposed on a region of a first package 100. In this case, in a similar manner to the second embodiment 902, an upper surface of a first molded portion 130 may have a step difference. The step difference may be formed in a region in which a rigid region 310 is disposed, among the upper surface of the first molded portion 130. In this case, a thickness of the first molded portion 130 in a region in which the rigid region 310 is not disposed may be greater than a thickness of a first via 141. In this case, the thickness of the first via 141 may be interpreted as having the same meaning as a depth of the first via 141 in the same direction as a stacking direction in which a first substrate 110, a first electronic component 120, and a first molded portion 130 are stacked.

In the package structure 905 according to the fifth embodiment, a second via 142 may be additionally formed in a region of the first molded portion 130 on which the rigid region 310 is not disposed. The second via 142 may be formed together in a process in which the first via 141 is formed, and a method of processing the second via 142 may also be the same as the first via 141.

The second via 142 may have a depth, greater than a depth of the first via 141, and an average diameter, larger than an average diameter of the first via 141. A difference in depth between the second via 142 and the first via 141 may be the same as the depth of the step difference formed in the first molded portion 130. An upper surface of the second via 142 may be coplanar with an upper surface of the first molded portion 130. Although not illustrated, a first pad may be disposed on the first substrate 110, and the second via 142 may expose at least a portion of the first pad. The exposed first pad may be in contact with and electrically connected to a second connection member 152 to be described later.

The second connection member 152 may be disposed in the second via 142 to electrically connect the first substrate 110 and a second substrate 210. The second connection member 152 may have the solder ball shape, illustrated in FIG. 7, by pasting a conductive metal to fill in the second via 142 and then curing and/or reflowing the conductive metal. Since the second via 142 may have a depth and an average width, greater than those of a first via 141, the second connection member 152 disposed in the second via 142 may have a volume, greater than those of the first connection member 151 disposed in the first via 141. Therefore, reliability during signal transmission may be improved, and heat dissipation characteristics may also be improved.

Referring to FIG. 7, the second substrate 210 may include a second pad 211, as described above. A portion of the second pad 211 may be in contact with and electrically connected to the second connection member 152. The other portion of the second pad 211 may be in contact with a third connection member 153, to be electrically connected to a third pad 311 of the rigid-flexible substrate 300.

Referring to FIG. 7, since the package structure 905 according to the fifth embodiment, described above, may include an LGA type structure, a volume of the solder ball may be reduced. Therefore, it may be advantageous in reducing in volume and size of the package structure 905.

Figure 8:
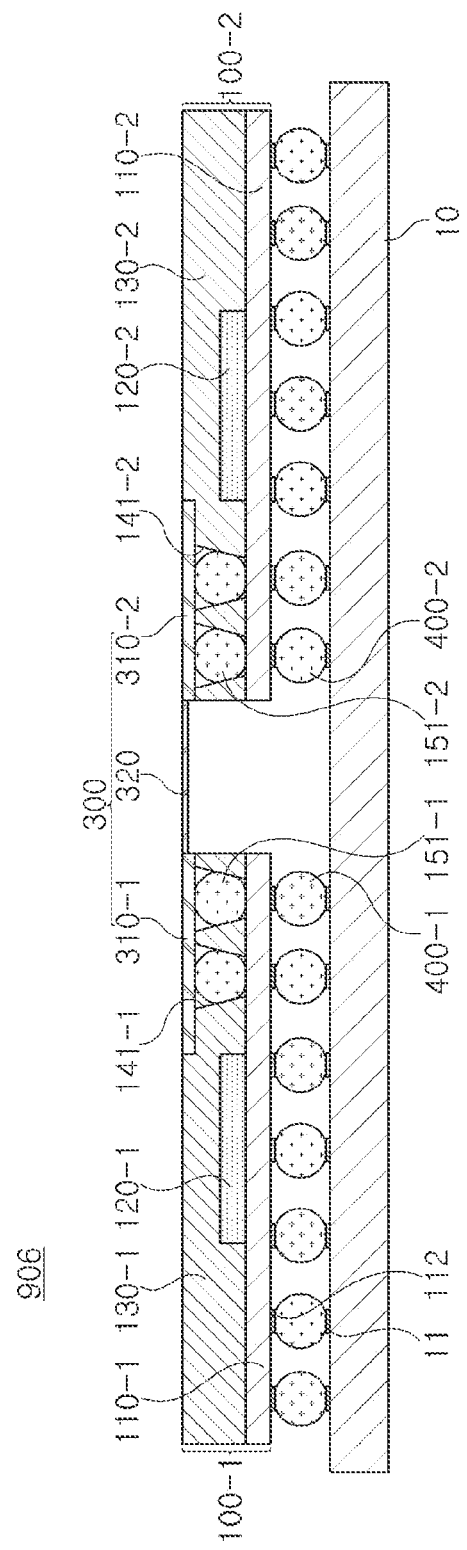
FIG. 8 is a cross-sectional view schematically illustrating a package mounting substrate according to a sixth embodiment of the present disclosure.

FIG. 8 is a cross-sectional view schematically illustrating a package mounting substrate according to a sixth embodiment of the present disclosure.

FIG. 8 illustrates a structure of a package mounting substrate 906 according to a sixth embodiment in which the package structure 902 according to the second embodiment, described above, may be disposed in plural on a mainboard 10, and the plurality of package structures 902 may be connected to each other.

In a package mounting substrate 906 according to a sixth embodiment of FIG. 8, a 1-1 package 100-1 and a 1-2 package 100-2 may be included. With respect to the 1-1 and the 1-2 packages 100-1 and 100-2, the description of the first package 100 may be equally applied. In addition, first and second rigid regions 310-1 and 310-2 may be included. Similarly, with respect to the first and second rigid regions 310-1 and 310-2, the description of the rigid-flexible substrate 300 may be equally applied, and an overlapped description thereof will be omitted.

As illustrated in FIG. 8, a 1-1 package 100-1 and a 1-2 package 100-2 may be disposed on a mainboard 10 and first and second solder balls 400-1 and 400-2 may be arranged therebetween, respectively, to form an electrical connection therebetween.

The 1-1 package 100-1 may include a 1-1 electronic component 120-1 disposed on a 1-1 substrate 110-1, a 1-1 molding portion 130-1 covering the 1-1 electronic component 120-1, a 1-1 via 141-1, and a 1-1 connection member 151-1 disposed in the 1-1 via 141-1.

Similarly, the 1-2 package 100-2 may include a 1-2 electronic component 120-2 disposed on a 1-2 substrate 110-2, a 1-2 molding portion 130-2 covering the 1-2 electronic component 120-2, a 1-2 via 141-2, and a 1-2 connection member 151-2 disposed in the 1-2 via 141-2.

A lower electrode pad 112 may be disposed below the 1-1 and 1-2 substrates 110-1 and 110-2. The lower electrode pad 112 and a connection pad 11 on the mainboard 10 may be electrically connected to each other through the solder balls 400-1 and 400-2. In FIG. 8, although the lower electrode pad 112 and the connection pad 11 are illustrated to have a structure protruding from the 1-1 and 1-2 substrates 110-1 and 110-2 and the mainboard 10, a solder resist layer having an opening may be further disposed on the lower electrode pad 112 and the connection pad 11, to expose only a region of each of the lower electrode pad 112 and the connection pad 11, while protecting the lower electrode pad 112 and the connection pad 11.

In the package mounting substrate 906 according to this embodiment, the 1-1 and 1-2 packages 100-1 and 100-2 may be electrically connected through the mainboard 10 and may be electrically connected through the rigid-flexible substrate 300 at the same time. Therefore, the number of signal transmission paths may increase, to improve signal transmission reliability and reduce resistance, and to allow rapid signal transmission.

Hereinafter, overlapped descriptions may be the same as those described above, and thus will be omitted.

In the present specification, the words "lateral portion," "lateral surface," and the like are used to refer to left/right directions or surfaces in the left/right directions with respect to the drawings for convenience, the words "in a position higher than a position of," "upper portion," "upper surface," and the like are used to refer to an upward direction or surfaces in the upward direction with respect to the drawings for convenience, and the words "in a position lower than a position of", "lower portion", "lower surface", and the like are used to refer to a downward direction or surfaces in the downward direction with respect to the drawings for convenience. In addition, being positioned in the "lateral portion," "in a position higher than a position of," in the "upper portion," "in a position lower than a position of", or in the "lower portion" may be a concept including not only a case in which a target component is in direct contact with a reference component in a corresponding direction, but also a case in which a target component is positioned in a corresponding direction, but is not in direct contact with a reference component. It should be understood that, the definitions refer to directions for convenience of explanation, the scope of the claims is not particularly limited by the description of such directions, and the concepts of the upward/downward directions may be changed at any time.

The term of "connect" or "connection" in the present specification may not be only a direct connection, but also a concept including an indirect connection through an adhesive layer or the like. In addition, the term "electrically connected" or "electrical connection" in the present specification is a concept including both a physical connection and a physical non-connection. Also, the expressions of "first," second," etc. in the present specification are used to distinguish one component from another, and do not limit the order and/or importance of the components. In some cases, without departing from the spirit of the present disclosure, a "first" component may be referred to as a "second" component, and similarly, a "second" component may be referred to as a "first" component.

The expression "example" used in this specification does not refer to the same embodiment to each other, but may be provided for emphasizing and explaining different unique features. However, the above-mentioned examples do not exclude that the above-mentioned examples are implemented in combination with the features of other examples. For example, although the description in a specific example is not described in another example, it can be understood as an explanation related to another example, unless otherwise described or contradicted by the other example.

The terms used in the present disclosure are used only to illustrate various examples and are not intended to limit the present inventive concept. Singular expressions include plural expressions unless the context clearly dictates otherwise.

As one of the various effects of the present disclosure, an electronic component embedded substrate having an asymmetrical shape that may be advantageous for thinning may be provided.

As another of the various effects of the present disclosure, a package structure capable of transmitting a signal between packages through a path, other than a mainboard, may be provided.

While example embodiments have been illustrated and described above, it will be apparent to those skilled in the art that modifications and variations could be made without departing from the scope of the present disclosure as defined by the appended claims.

What is claimed is:

1. A package structure comprising:
a first package including:
a first substrate; and
a first molded portion disposed on the first substrate;
a first electronic component disposed on the first substrate and covered by the first molded portion;
a first via disposed in the first molded portion; and
a first connection member disposed in the first via to connect the first substrate and the rigid-flexible substrate; and
a rigid-flexible substrate disposed on at least a portion of the first package and having a rigid region and a flexible region,
wherein the first molded portion is disposed between the first substrate and the rigid-flexible substrate,
wherein the first connection member is spaced apart from the first electronic component.

2. The package structure of claim 1, wherein the rigid region is disposed on the first molded portion,
the flexible region protrudes with respect to a lateral surface of the first molded portion.

3. The package structure of claim 2, wherein one surface of the first via is connected to the first substrate and another surface of the first via opposing the one surface is connected to the rigid-flexible substrate.

4. The package structure of claim 1, further comprising a second package disposed on the first substrate and the rigid-flexible substrate and including a second substrate and a second molded portion disposed on the second substrate.

5. The package structure of claim 4, further comprising a solder ball connecting the second substrate and the rigid-flexible substrate.

6. The package structure of claim 4, wherein the rigid region is disposed in a region on the first molded portion.

7. The package structure of claim 6, further comprising a third connection member connecting the second package and the rigid-flexible substrate.

8. The package structure of claim 7, wherein an upper surface of the first molded portion has a step difference in a region in which the rigid region is disposed.

9. The package structure of claim 7, wherein the rigid region covers an upper portion of the first via.

10. The package structure of claim 7, wherein the first package further comprises a second via in a region of the first molded portion in which the rigid region is not disposed.

11. The package structure of claim 10, wherein the first package further comprises a second connection member disposed in the second via to connect the first substrate and the second substrate.

12. The package structure of claim 11, wherein a volume of the second connection member is larger than a volume of the first connection member.

13. The package structure of claim 4, wherein
the second package further comprises a second electronic component disposed on the second substrate and covered by the second molded portion.

14. A package mounting substrate comprising:
a mainboard;
a first package disposed on the mainboard, and including:
a first substrate;
a first electronic component disposed on the first substrate; and
a first molded portion covering the first electronic component a second package disposed on the mainboard, and including a second substrate;
a first solder ball disposed between the mainboard and the first substrate to connect the mainboard to the first package;
a second solder ball disposed between the mainboard and the second substrate to connect the mainboard to the second package; and
a rigid-flexible substrate spaced apart from the mainboard, and including first and second rigid regions and a flexible region,
wherein the first rigid region is disposed on at least a portion of the first package to be connected to the first package, and
the second rigid region is disposed on at least a portion of the second package to be connected to the second package.

15. The package mounting substrate of claim 14, wherein the first package further includes:
a first via disposed in the first molded portion; and
a first connection member disposed in the first via, the first and second package further includes:
a second electronic component disposed on the second substrate;
a second molded portion covering the second electronic component;
a second via disposed in the second molded portion; and
a second connection member disposed in the second via,
wherein the first connection member connects the first rigid region and the first substrate, and
the second connection member connects the second rigid region and the second substrate.

16. The package mounting substrate of claim 14, wherein the flexible region is disposed between the first rigid region and the second rigid region.

17. A package structure comprising:
a first package including:
a first substrate;
a first molded portion disposed on the first substrate; and
a first electronic component disposed on the first substrate and embedded in the first molded portion; and
a rigid-flexible substrate including a rigid region disposed on a portion of the first package and a flexible region extending from the rigid region and disposed outside the first package,
wherein the first electronic component is disposed at a side of the first molded portion, and
the side of the first molded portion is closer to the first substrate and farther away from the rigid-flexible substrate, as compared to another side of the first molded portion opposing the one side of the first molded portion.

18. The package structure of claim 17, further comprising a second package,
wherein the rigid region is disposed between the first package and the second package and connects the first package and the second package to each other.

19. The package structure of claim 18, wherein the first package further includes a first connection member extending from the first substrate to connect the rigid region, and a second connection member extending from the first substrate to connect to the second package.

20. The package structure of claim 17, further comprising a second package,
> wherein the rigid-flexible substrate further includes another rigid region extending from the flexible region and disposed on a portion of the second package, and
>
> the first package and the second package are connected to each other through at least the rigid-flexible substrate.

21. The package structure of claim 17, wherein the first package further includes a first connection member extending from an upper surface of the first substrate to connect to the rigid region, and a second connection member extending from a lower surface of the first substrate.

\* \* \* \* \*